(12) United States Patent
Bunyan (10) Patent No.: US 6,432,497 B2
(45) Date of Patent: Aug. 13, 2002

(54) DOUBLE-SIDE THERMALLY CONDUCTIVE ADHESIVE TAPE FOR PLASTIC-PACKAGED ELECTRONIC COMPONENTS

(75) Inventor: Michael H. Bunyan, Chelmsford, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/109,550

(22) Filed: Jul. 2, 1998

Related U.S. Application Data
(60) Provisional application No. 60/053,974, filed on Jul. 28, 1997, now abandoned.

(51) Int. Cl.$^7$ .............................................. H01L 23/373
(52) U.S. Cl. ...................... 428/40.1; 257/712; 257/713; 428/40.2; 428/41.9; 428/131; 428/137; 428/354
(58) Field of Search ................................. 428/40.1, 40.2, 428/41.9, 131, 137, 354; 257/712, 713

(56) References Cited

U.S. PATENT DOCUMENTS

| | | | |
|---|---|---|---|
| 4,606,962 A | 8/1986 | Reylek et al. | 428/148 |
| 4,839,206 A | 6/1989 | Waldenberger | 428/40.1 |
| 4,842,911 A | 6/1989 | Fick | 428/40.1 |
| 5,213,868 A | 5/1993 | Liberty et al. | 428/354 |
| 5,298,791 A | 3/1994 | Liberty et al. | 257/707 |
| 5,359,768 A | 11/1994 | Haley | 29/840 |
| 5,402,006 A | 3/1995 | O'Donley | 257/796 |
| 5,471,027 A | 11/1995 | Call et al. | 219/815.3 |
| 5,533,256 A | 7/1996 | Call et al. | 29/840 |
| 5,545,473 A | 8/1996 | Ameen et al. | 428/283 |
| 5,648,156 A | 7/1997 | Hayashi | 428/323 |

FOREIGN PATENT DOCUMENTS

| | | |
|---|---|---|
| JP | 09107057 | 4/1997 |
| WO | WO 96/37915 | 5/1996 |

OTHER PUBLICATIONS

International Search Report in PCT Application No. PCT/US98/14975 for "Double Side, Thermally Conductive Adhesive Tape for Plastic–Packaged Electronic Components".

"Module for Improved Heat Dissipation" Research Disclosure, No. 302, Jun. 1989, p. 414.

Chomerics "Cho–Therm Thermal Interface Materials" copyrighted 1993.

3M Silicone/Acrylic Double Coated Film Tape—Technical Data Jul., 1994.

*Primary Examiner*—Nasser Ahmad
(74) *Attorney, Agent, or Firm*—John A. Molnar, Jr.

(57) ABSTRACT

A thermally conductive interface, which may be in the form of a double-sided, pressure sensitive adhesive tape, disposable intermediate a heat-generating source having a first heat transfer surface formed of a first material having a low surface energy, and a thermal dissipation member having a second heat transfer surface which is formed of a second material having a surface energy substantially higher than the surface energy of the first material, and which is disposable opposite the first heat transfer surface of the heat-generating source in a spaced-apart, heat transfer adjacency therewith. The interface includes a first pressure sensitive adhesive (PSA) surface which is bondable under pressure to at least a portion of the first heat transfer surface of the heat-generating source, and an opposing second pressure sensitive adhesive (PSA) surface bondable under pressure to at least a portion of the second heat transfer surface of the heat-generating source. The first PSA surface is presented from a layer of a thermally-conductive, first pressure sensitive adhesive composition, preferably silicone-based, having an affinity to the first heat transfer surface of the heat generating source. In turn, the second PSA surface is presented from a layer of a second pressure sensitive adhesive composition, preferably acrylic-based, different from the first composition and having an affinity to the second heat transfer surface of the thermal dissipation member. The interface is particularly adapted for bonding a plastic packaged electronic component to a metal heat sink.

12 Claims, 2 Drawing Sheets

DOUBLE-SIDE THERMALLY CONDUCTIVE ADHESIVE TAPE FOR PLASTIC-PACKAGED ELECTRONIC COMPONENTS

RELATED CASES

The present application claims priority to U.S. Provisional Application Ser. No.60/053,974; filed Jul. 28, 1997 now abandoned.

BACKGROUND OF THE INVENTION

The present invention relates broadly to a thermal management material which is interposable as an interface between, for example, the heat transfer surfaces of a heat-generating, electronic component, such as an integrated circuit (IC) chip, and a thermal dissipation member, such as a heat sink or circuit board, for the conductive cooling of the electronic component. More particularly, the invention relates to a double-side, pressure sensitive adhesive tape adapted for attaching a metal heat sink to a plastic-encapsulated or "packaged," heat-generating electronic component.

Circuit designs for modem electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmicly or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink. The heat sink may be a dedicated, thermally-conductive metal plate, or simply the chassis or circuit board of the device. However, beyond the normal temperature gradients between the electronic component and the heat sink, an appreciable temperature gradient is developed as a thermal interfacial impedance or contact resistance at the interface between the bodies.

That is, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a layer of a thermally-conductive, electrically-insulating material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

For example, U.S. Pat. No. 4,299,715 discloses a wax-like, heat-conducting material which is combined with another heat-conducting material, such as a beryllium, zinc, or aluminum oxide powder, to form a mixture for completing a thermally-conductive path from a heated element to a heat sink. A preferred wax-like material is a mixture of ordinary petroleum jelly and a natural or synthetic wax, such as beeswax, palm wax, or mineral wax, which mixture melts or becomes plastic at a temperature above normal room temperature. The material can be excoriated or ablated by marking or rubbing, and adheres to the surface on which it was rubbed. In this regard, the material may be shaped into a rod, bar, or other extensible form which may be carried in a pencil-like dispenser for application.

U.S. Pat. No. 4,466,483 discloses a thermally-conductive, electrically-insulating gasket. The gasket includes a web or tape which is formed of a material which can be impregnated or loaded with an electrically-insulating, heat conducting material. The tape or web functions as a vehicle for holding the meltable material and heat conducting ingredient, if any, in a gasket-like form. For example, a central layer of a solid plastic material may be provided, both sides of which are coated with a meltable mixture of wax, zinc oxide, and a fire retardant.

U.S. Pat. No. 4,473,113 discloses a thermally-conductive, electrically-insulating sheet for application to the surface of an electronic apparatus. The sheet is provided as having a coating on each side thereof a material which changes state from a solid to a liquid within the operating temperature range of the electronic apparatus. The material may be formulated as a meltable mixture of wax and zinc oxide.

U.S. Pat. No. 4,764,845 discloses a thermally-cooled electronic assembly which includes a housing containing electronic components. A heat sink material fills the housing in direct contact with the electronic components for conducting heat therefrom. The heat sink material comprises a paste-like mixture of particulate microcrystalline material such as diamond, boron nitride, or sapphire, and a filler material such as a fluorocarbon or paraffin. The greases and waxes of the aforementioned types heretofore known in the art, however, generally are not self-supporting or otherwise form stable at room temperature and are considered to be messy to apply to the interface surface of the heat sink or electronic component. Moreover, use of such materials typically involves hand application or lay-up by the electronics assembler which increases manufacturing costs.

Alternatively, another approach is to substitute a cured, sheet-like material or pad for the silicone grease or wax material. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics Division of Parker-Hannifin Corp., 77 Dragon Court, Woburn, Mass. 01888. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1–50 microns (0.05–2 mils).

U.S. Pat. No. 4,654,754 discloses a "thermal link" for providing a thermal pathway between a heat source and a heat sink. In one embodiment, a thermally conductive elastomeric material, such as a silicone filled with silver-copper particles, is formed into a mat having a plurality of raised sections. The raised sections deform under low pressure to conform to the space between the heat source and the heat sink.

U.S. Pat. No. 4,782,893 discloses a thermally-conductive, electrically-insulative pad for placement between an electronic component and its support frame. The pad is formed of a high dielectric strength material in which is dispersed diamond powder. In this regard, the diamond powder and a liquid phase of the high dielectric strength material may be mixed and then formed into a film and cured. After the film is formed, a thin layer thereof is removed by chemical etching or the like to expose the tips of the diamond particles. A thin boundary layer of copper or other metal then is bonded to the top and bottom surfaces of the film such that the exposed diamond tips extend into the surfaces to provide pure diamond heat transfer paths across the film. The pad may be joined to the electronic component and the frame with solder or an adhesive.

U.S. Pat. No. 4,842,911 discloses a composite interfacing for the withdrawal and dissipation of heat from an electronic, solid-state device by an associated heat sink. The interfacing consists of dual layers of a compliant silicone rubber carried on either side of a porous glass cloth. The layers are filled with finely-divided heat-conducting particles which may be formed of alumina or another metal oxide, or an electrically-conductive material such as nickel or graphite. One of the silicone layers is pre-vulcanized, with the other being cured and bonded in place once the interfacing has been applied to the heat sink surface for abutment with the electronic device.

Commonly-assigned U.S. Pat. No. 4,869,954 discloses a form-stable material for use in transferring thermal energy from an electronic component to a heat sink. The material is formulated as the reaction product of a urethane resin and a curing agent, and is filled with one or more thermally conductive fillers such as zinc oxide, aluminum oxide, magnesium oxide, aluminum nitride, or boron nitride. The material may be formed as including a support layer of a glass cloth, plastic mesh or film, or a metal mesh or foil.

U.S. Pat. No. 4,965,699 discloses a printed circuit device which includes a memory chip mounted on a printed circuit card. The card is separated from an associated cold plate by a layer of a silicone elastomer which is applied to the surface of the cold plate.

U.S. Pat. No. 4,974,119 discloses a heat sink assembly which includes an electronic component supported on a printed circuit board in a spaced-apart relationship from a heat dispersive member. A thermally-conductive, elastomeric layer is interposed between the board and the electronic component. The elastomeric member may be formed of silicone and preferably includes a filler such as aluminum oxide or boron nitride.

U.S. Pat. No. 4,979,074 discloses a printed circuit board device which includes a circuit board separated from a thermally-conductive plate by a pre-molded sheet of silicone rubber. The sheet may be loaded with a filler such as alumina or boron nitride.

U.S. Pat. No. 5,060,114 discloses a conformable, gel-like pad having a thermally-conductive filler for conducting heat away from a packaged electronic power device. The pad is formed of a cured silicone resin which is filled with a thermally-conductive material such as aluminum powder, nickel, aluminum oxide, iron oxide, beryllium oxide, or silver. A thin sheet of a thermally-conductive metal such as aluminum is positioned in contact with the surface of the conformable pad for increased thermal transfer.

Commonly-assigned U.S. Pat. No. 5,137,959 discloses a thermally-conductive, electrically insulating interface material comprising a thermoplastic or cross linked elastomer filled with hexagonal boron nitride or alumina. The material may be formed as a mixture of the elastomer and filler, which mixture then may be cast or molded into a sheet or other form.

U.S. Pat. No. 5,151,777 discloses an interface device of thermally coupling an integrated circuit to a heat sink. The device includes a first material, such as copper, having a high thermal conductivity, which is provided to completely surround a plurality of inner core regions. The inner core regions contain a material such as an iron-nickel alloy having a low coefficient of thermal expansion.

Commonly-assigned U.S. Pat. No. 5,194,480 discloses another thermally-conductive, electrically-insulating filled elastomer. A preferred filler is hexagonal boron nitride. The filled elastomer may be formed into blocks, sheets, or films using conventional methods.

Commonly-assigned U.S. Pat. Nos. 5,213,868 and 5,298,791 disclose a thermally-conductive interface material formed of a polymeric binder and one or more thermally-conductive fillers. The fillers may be particulate solids, such as aluminum oxide, aluminum nitride, boron nitride, magnesium oxide, or zinc oxide. The material may be formed by casting or molding, and preferably is provided as a laminated acrylic pressure sensitive adhesive (PSA) tape. At least one surface of the tape is provided as having channels or through-holes formed therein for the removal of air from between that surface and the surface of a substrate such as a heat sink or an electronic component. Such a tape is marketed commercially by the Chomerics Division of Parker-Hannifin Corp., Woburn, Mass., under the tradename THERMATTACH®.

U.S. Pat. No. 5,309,320 discloses a "conduction converter" for a printed circuit board having electronic components. The converter includes a body of a thermally conductive dielectric material, such as an alumina-filled RTV silicone, which is molded to the exact configuration of the electronic components. The converter may be clamped intermediate a cold plate and the circuit board to conductively remove heat from the electronic components.

U.S. Pat. No. 5,321,582 discloses an electronic component heat sink assembly which includes a thermally-conductive laminate formed of polyamide which underlies a layer of a boron nitride-filled silicone. The laminate is interposed between the electronic component and the housing of the assembly.

Commonly-assigned U.S. Pat. No. 5,510,174 discloses a thermally-conductive, titanium diboride ($TiB_2$) filler providing improved thermal conductivity at low application pressures. The filler may be incorporated into elastomers, films, and tapes.

U.S. Pat. No. 5,545,473 discloses a thermally conductive interface for electronic components. The interface is formed of an open structure fluoropolymer material such as an expanded polytetrafluoroethylene. Thermally conductive particles, which may be formed of a metal or metal oxide, or another material such as boron nitride, aluminum nitride, diamond powder, or silicone carbide, are attached to portions of the fluoropolymer material.

U.S. Pat. Nos. 5,533,256 and 5,471,027 disclose a method of joining a multi-layered ceramic (MLC) electronic package. The method involves the use of a double-sided, pressure-sensitive, thermally-conductive adhesive tape to directly bond the heat sink to an upper, exposed surface of the chip as mounted on a circuit board.

International Publication No. WO 96/37915 discloses an electronic assembly including an active circuit having surface mount components, an insulating layer, and an aluminum heat sink. The insulating layer comprises an unfilled thermoplastic sheet having adhesive layers on opposite sides thereof. The adhesive layers preferably are selected as a thermoplastic or thermosetting adhesive or pressure sensitive adhesive formulation containing a thermally-conductive and, optionally, electrically-conductive filler material which may be a metallic, inorganic, or ceramic particulate. The unfilled sheet preferably is a thin film of an engineering thermoplastic such as a polyester, polyetherimides, polyimide, or the like. A preferred adhesive is a solvent-borne, water-based, or hot melt thermoplastic adhesive.

U.S. Pat. No. 4,606,962 discloses an electrically and thermally conductive adhesive transfer tape for attaching individual semiconductor dies or chips to conductive substrates. The transfer tape comprises a flexible, low-adhesion carrier web to which is lightly adhered a layer of an adhesive containing electrically and thermally conductive particles. The particle containing adhesive layer is removed from the carrier web and compressed between the die and the substrate for attaching the die to the substrate.

A double coated film tape is marketed commercially by 3M, St. Paul, Minn., under the tradename "9731." A firm silicone PSA system is coated on the inside of a 0.055-inch (0.14 mm) thick polyester film carrier, with a high performance acrylic adhesive being coated on the outside of the carrier. Such tape is stated to feature the strong holding power of a silicone adhesive to various silicone surfaces, along with the high adhesion of an acrylic adhesive to a variety of surfaces.

Sheets, pads, and tapes of the above-described types have garnered general acceptance for use as interface materials in the conductive cooling of electronic component assemblies such as the semiconductor chips, i.e., dies described in U.S. Pat. No. 5,359,768. It will be appreciated, however, that further improvements in these types of interface materials are called for in response to developments made by the electronics industry. Specifically regarding the fabrication of semiconductor dies, heretofore such dies typically were packaged by encapsulation in a ceramic chip carrier. External connections provided on the chip carrier allow for the chip to be mounted onto a printed circuit board (PCB) by wire bonding electrical leads on the carrier through a common mounting surface on the board, or by surface mounting the carrier directly to the mounting surface of the board.

Recently, the industry trend has been away from ceramic chip carrier packages and toward plastic packages. Usually molded of an engineering thermoplastic material such as polyethylene terephthalate (PETP), polyphenylene sulfide (PPS), polyetherimide (PEI), polyetherether ketone (PEEK), polyetherketone (PEK), or polyimide (PI), or a thermosetting material such as an epoxy or an epoxy-phenolic composite, these plastic chip packages typically are less expensive than their ceramic counterparts. However, the thermal interface materials previously known in the art were designed for use with ceramic substrates, and not for use with the low surface energy, plastic substrates now common in the commercial electronics market. Especially desired, therefore, would be a thermal interface material which is particularly adapted to bond or otherwise couple a plastic packaged die or other heat generating electronic component to a metal thermal dissipation member, such as a plate or pin fin heat sink, or to another metal surface such as that of a cold plate or chassis. The preferred material would provide an effective thermal interface between the electronic component and the heat sink, while exhibiting improved adhesion to low surface energy substrates.

BROAD STATEMENT OF THE INVENTION

The present invention is directed to a thermal interface, and particularly to a double-sided, thermally-conductive, pressure sensitive adhesive (PSA) tape or other laminate adapted for bonding or otherwise coupling a plastic packaged electronic die or other component in a conductive heat transfer relationship with a metal thermal dissipation member such as a metal heat sink or chassis. In this regard, the interface includes a PSA surface or side formed of a layer of a thermally-conductive, first PSA composition having an affinity to the low energy surface of the die material, and an opposing second PSA surface or side formed of a layer of a second PSA composition which is different from the first composition and which has an affinity to the higher energy surface of the heat sink or chassis material.

In a preferred embodiment, the second PSA composition is formulated as an acrylic-based PSA which is rendered thermally conductive via its loading with a thermally-conductive particulate filler such as an aluminum oxide. The first PSA composition, in turn, is preferably is formulated as a silicone-based PSA which, optionally, is rendered thermally conductive via its loading with a thermally-conductive, particulate filler such as an aluminum oxide. For ease of handling and application, the adhesive layers may be coated on respective sides of a carrier interlayer, such as a polymeric film or a metal foil, to form a tape which may be faced on one or both sides with a release liner and then wound on a roll. In use, individual interface elements may be machine or manually cut from the roll as configured to conform to the margins of the associated heat transfer surfaces of, for example, the electronic component and heat sink. Then, with the release liner or liners removed, each side of the tape may be adhered under pressure to the corresponding heat transfer surface of the electronic component or heat sink. Optionally, the surfaces of the adhesives layers may be embossed with a cross-hatched pattern, as is shown in the commonly-assigned U.S. Pat. Nos. 5,213,868 and 5,298,791, for additional conformably to the heat transfer surfaces with minimal air pockets.

A feature of a preferred embodiment of the present invention therefore is to provide an assembly which includes a heat-generating source, a thermal dissipation member, and a thermally conductive interface disposed intermediate the heat-generating source and the thermal dissipation member to provide a thermally conductive pathway therebetween. The heat-generating source has a first heat transfer surface formed of a first material, such as a plastic, having a low surface energy, with the thermal dissipation member having a second heat transfer surface which is formed of a second material, such as a metal, having a surface energy substantially higher than the surface energy of the first material. The second heat transfer surface of the thermal dissipation member is disposed opposite the first heat transfer surface of the heat-generating source in a spaced-apart, heat transfer adjacency therewith. The interface includes a first pressure sensitive adhesive (PSA) surface bonded to at least a portion of the first heat transfer surface of the heat-generating source and an opposing second pressure sensitive adhesive (PSA) surface bonded to at least a portion of the second heat transfer surface of the heat-generating source. The first PSA surface is presented from a layer of a thermally conductive first pressure sensitive adhesive composition, preferably silicone-based, having an affinity to the first heat transfer surface of the heat generating source. The second PSA surface is presented from a layer of a second pressure sensitive adhesive composition, preferably acrylic-based, different from the first composition and having an affinity to the second heat transfer surface of the thermal dissipation member.

Another feature of a preferred embodiment of the present invention is to provide a thermally conductive interface disposable intermediate a heat-generating source having a first heat transfer surface formed of a first material, such as a plastic, having a low surface energy, and a thermal dissipation member having a second heat transfer surface which is formed of a second material, such as a metal, having a surface energy substantially higher than the surface energy of the first material, and which is disposable opposite the first heat transfer surface of the heat-generating source in a spaced-apart, heat transfer adjacency therewith. The interface includes a first pressure sensitive adhesive (PSA) surface which is bondable under pressure to at least a portion of the first heat transfer surface of the heat-generating source, and an opposing second pressure sensitive adhesive (PSA) surface bondable under pressure to at least a portion of the second heat transfer surface of the heat-generating source. The first PSA surface is presented from a layer of a thermally conductive, first pressure sensitive adhesive composition, preferably silicone-based, having an affinity to the first heat transfer surface of the heat generating source. In turn, the second PSA surface is presented from a layer of a second pressure sensitive adhesive composition, preferably acrylic-based, different from the first composition and having an affinity to the second heat transfer surface of the thermal dissipation member.

Another feature of a preferred embodiment of the present invention is to provide a method of attaching a heat-generating source having a first heat transfer surface formed of a first material having a low surface energy to a thermal dissipation member having a second heat transfer surface formed of a second material having a surface energy substantially higher than the surface energy of the first material. The method involves providing a thermally conductive tape including opposing first and second pressure sensitive adhesive (PSA) surfaces. The first PSA surface is presented from a layer of a thermally conductive, first pressure sensitive adhesive composition having an affinity to the first heat transfer surface of the heat generating source, with the second pressure sensitive adhesive (PSA) surface being presented from a layer of a second pressure sensitive adhesive composition which is different from the first composition and has an affinity to the second heat transfer surface of the thermal dissipation member. In no particular order, at least a portion of the first and second heat transfer surfaces of the heat-generating source and thermal dissipation member are bonded under pressure to the corresponding first or second PSA surface of the tape such that the first heat transfer surface is disposed opposite the second heat transfer surface of the heat generating source in a spaced-apart, conductive heat transfer adjacency therewith.

Advantages of the present invention include an interface material that may be provided in the form of a double-sided, pressure sensitive adhesive tape, and that is particularly adapted for bonding a low surface energy substrate, such as a plastic packaged electronic component, without the use of a primer to a metal heat sink or chassis wall. Additional advantages include a double-sided, thermally-conductive adhesive tape which may be provided in a roll for automated application, and which can be consistently applied using either automated or manual processes for precise thermal and adhesive properties. Still further advantages include a thermal interface offering an easy "peel and stick" installation without the use of mechanical fasteners such as clips or screws. Yet further advantages include a thermal interface that can be removed after application for repair or rework. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

The drawings will be described further in connection with the following Detailed Description of the Invention.

DETAILED DESCRIPTION OF THE INVENTION

Figure 1:
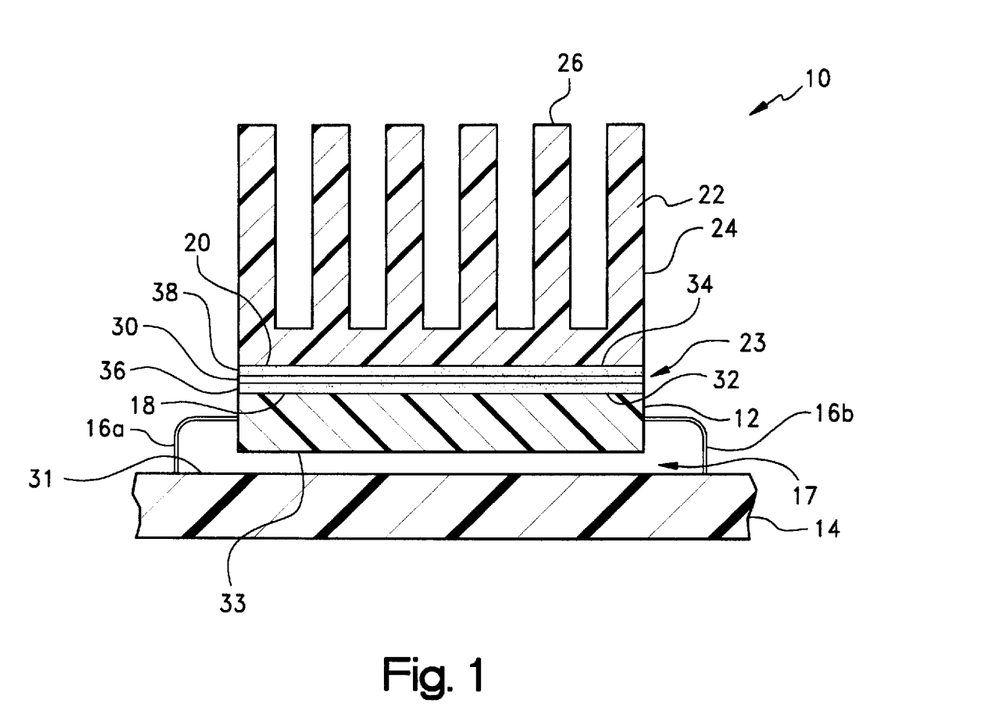
FIG. 1 is a fragmentary, cross-sectional view of an electrical assembly in accordance with the present invention wherein a plastic-packaged, heat-generating electronic component is attached for its conductive cooling to a metal heat sink by way of a thermally conductive interface having one side formed of a layer of a thermally-conductive, pressure sensitive adhesive composition exhibiting an affinity to the low energy plastic surface of the electronic component and an opposing second side formed of a layer of a thermally-conductive, pressure sensitive adhesive composition which is different from the first composition and which exhibits an affinity to the higher energy metal surface of the heat sink.

Referring to the drawings wherein corresponding reference characters indicate corresponding elements throughout the several views shown, depicted generally at 10 in FIG. 1 is an electrical assembly according to the present invention which includes a heat-generating source such as a digital or analog electronic component, 12, supported on an associated printed circuit board (PCB) or other substrate, 14. Electrical component 12 is considered for illustrative purposes to be an integrated microchip, microprocessor, transistor, or other power semiconductor die which is packaged by encapsulation in a chip carrier formed of a plastic material such as polyethylene terephthalate (PETP), polyphenylene sulfide (PPS), polyetherimide (PEI), polyetherether ketone (PEEK), polyetherketone (PEK), polyimide (PI), epoxy, or epoxy-phenolic composite. Component 12 alternatively may be an ohmic or other heat-generating subassembly or source such as a diode, relay, resistor, transformer, amplifier, diac, or capacitor, but in any event generally will have an operating temperature in the range of about 60–120° C. For the electrical connection of component 12 to board 14, a pair of leads or pins, 16a and 16b, are provided as extending from either end of component 12 into a soldered or other connection with board 14. Leads 16 additionally may support component 12 above board 14 to define a gap, represented at 17, which typically is about 3 mils (75 microns), therebetween. Alternatively, component 12 may be received directly on board 14.

As supported on board 14, electronic component 12 presents a first heat transfer surface, 18, which is disposed in a spaced-apart, heat transfer adjacency with an opposing second heat transfer surface, 20, of an associated thermal dissipation member, 22, to define an interface region, referenced at 23, therebetween. Dissipation member 22 typically is constructed of a metal, such as aluminum or copper, or other material having a heat capacity relative to that of component 12 to be effective is dissipating thermal energy conducted or otherwise transferred therefrom. However, in being formed of a metal material, second heat transfer surface 20 exhibits a surface energy that is substantially higher than the first heat transfer which is formed of a relatively low surface energy plastic material. As used herein, "low surface energy" is given its conventional definition of less than about 100 dynes/cm. In contrast, the second heat transfer surface 20 generally will be considered to have a "high surface energy" of greater than about 500 dynes/cm.

For purposes of the present illustration, thermal dissipation member 22 is considered to be a metal heat sink which, as shown, may be of a plate fin variety configured as having a generally planar base portion, 24, from which extends a plurality of cooling fins, one of which is referenced at 26. Alternatively, thermal dissipation member 22 may be provided as a pin fin or other heat sink, heat exchanger, or cold plate, and also may be the PCB itself, as well as an associated housing or chassis. With assembly 10 configured as shown, fins 26 assist in the convective cooling of component 12, but alternatively may be received within an associated cold plate or the like, not shown, for further conductive dissipation of the thermal energy transferred from component 12.

With the first heat transfer surface 18 of electronic component 12 disposed in opposing thermal adjacency with second heat transfer surface 20 of dissipation member 22, a sheet, pad, or other layer of a thermally-conductive interface, 30, is interposed therebetween within interfacing region 23 for providing a conductive pathway for the transfer of thermal energy from component 12 to dissipation member 20. By "thermally conductive," it is meant that the interface exhibits a thermal conductivity of between about 0.1 W/m-°K and about 1 W/m-°K. The pathway provided by interface 30 may be employed without or in conjunction with convective air circulation for effecting the cooling of component 12 and ensuring that the operating temperature thereof is maintained below specified limits. As may be seen in the cross-sectional view provided, interface 30 is both complaint and conformable within interfacing region 23 for the exclusion of air pockets or other voids therefrom. That is, interface 30 advantageously improves the efficiency and rate of heat transfer through the interfacing region by filling in the region to provide a generally continuous interface between the component 12 and the dissipation member 22, and by substantially conforming to the heat transfer surfaces 18 and 20 thereof. Although thermal dissipation member 22 is shown to be a separate heat sink member, board 14 itself may be used for such purpose by alternatively interposing interface 30 between surface 31 thereof and corresponding surface 33 of electronic component 12.

Interface 30 is a laminate which includes a first pressure sensitive adhesive (PSA) surface, 32, which is bonded under pressure to at least a portion of the first heat transfer surface 18 of electronic component 12, and an opposing second PSA surface, 34, which is bonded under pressure to at least a potion of the second heat-transfer surface 20 of dissipation member 22. In accordance with the precepts of the present invention, first PSA surface 23 is presented from a layer, 36, of a thermally-conductive first PSA composition having an affinity to the first heat transfer surface 20 of component 12. Second PSA surface 34, in turn, is presented from a layer, 38, of a second PSA composition which is different than the first PSA composition and which has an affinity to the second heat transfer surface of the dissipation member 22. The term "PSA" is used herein in its conventional sense to mean that the composition is formulated has having a glass transition temperature, surface energy, and other properties such that it exhibits some degree of tack at normal room temperature. By "affinity," it is meant that the first PSA composition exhibits a preferential adhesion to the low surface energy material of first heat transfer surface 18, with the second PSA composition exhibiting a corresponding preferential adhesion to the higher surface energy material of the second heat transfer surface 20. That is, there is a polar similarity or other attraction between the PSA composition and the adherend. For example, it is preferred that the first PSA composition exhibits a either a lap or die shear adhesion, according to ASTM D1002 or Chomerics Test Procedure No. 54, respectively, of at least about 100 psi (0.7 MPa) to the first heat transfer surface, and that the second PSA composition similarly exhibits either a lap or die shear adhesion, again according to ASTM D1002 or Chomerics Test Procedure No. 54, respectively, of at least about 100 psi (0.7 MPa) to second heat transfer surface 20. The adhesion may be developed from valence forces, mechanical interlocking action, or a combination thereof.

With first and second heat transfer surfaces 18 and 20 being formed, respectively, of a plastic and a metal material, it is preferred that the first PSA composition is formulated as a silicone-based PSA component or resin optionally blended with a thermally-conductive filler, with the second PSA component being formulated as a blend of an acrylic-based PSA component or resin and a thermally-conductive filler. In this regard, acrylic PSA's are known to exhibit strong adhesion to a variety of substrates including metal surfaces. However, due to their polar nature, acrylic PSA's generally exhibit relatively poor adhesion to low surface energy substrates as typified by polyolefins. For example, commercial acrylic PSA's have been observed to exhibit a 180° peel adhesion on untreated polyethylene of less than 0.5 lb/in. Silicone PSA's, in contrast, do exhibit good adhesion to low surface energy substrates such as polyolefins and other plastics. Advantageously, the use of two different PSA formulations facilitates that attachment of dissipation member 22 to component 12 without the use of a clip, spring, or clamp or the like which otherwise would have to be provided for applying an external force to develop an interface area contact between the interface 30 and surfaces 18 and 22.

The acrylic-based PSA component may be a homopolymer, copolymer, terpolymer, interpenetrating network, or blend of an acrylic or (meth)acrylic acid, an acrylate such as butyl acrylate or other alcohol ester, and/or an amide such as acrylamide. A preferred acrylic PSA, marketed commercially by H&N Chemicals, Totowa, N.J., under the trade designation Polytack™ 100 LV, comprises a blend of ethylene acrylate, acetone, isopropyl alcohol, and toluene at 45–50% solids. The silicone-based PSA component may include a dry or wet film silicone resin or gum. A preferred silicone PSA, marketed commercially by Adhesives Research, Glen Rock, Pa., under the trade designation 8026, comprises a polydimethylsiloxane gum and resin dispersion. Another preferred silicone, marketed by Flexcon, Spencer, Mass., under the trade designation 1078.

Depending upon the formulation, the respective acrylic or silicone-based PSA components may form a binder into which the thermally-conductive filler is dispersed. The filler generally is included within the binder in a proportion sufficient to provide the thermal conductivity desired for the intended application. With respect to the acrylic PSA formulation, a filler loading of between 20–80% by weight is considered preferred, with a loading of 40–60% being especially preferred. With respect to the silicone PSA formulation, only a filler loading of between about 0–10% by weight may be tolerated, with higher loading levels having been observed to deleteriously affect the adhesiveness of the silicone PSA. The size and shape of the filler, however, are not critical for the purposes of the present invention. That is, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.25–250 $\mu$m (0.01–10 mils), with a range of from about 0.250–75 $\mu$m (0.01–3 mils), being generally preferred, but as may vary depending upon the thickness of interface 30. The filler also may be selected as electrically-nonconductive such that interlayer 30 may provide an electrically-insulating but thermally-conductive barrier between electronic component 12 and thermal dissipation member 20. Suitable thermally-conductive fillers include boron nitride, aluminum oxide, aluminum nitride, titanium diboride, magnesium oxide, zinc oxide, silicon carbide, beryllium oxide, antimony oxide, and mixtures thereof. Such fillers characteristically exhibit a thermal conductivity of about 25–50 W/m-°K.

Additional fillers and additives may be included in the formulation depending upon the requirements of the particular application envisioned and to the extent that the thermal conductivity and electrical properties of the formulation are not overly compromised. Such fillers and additives may include conventional wetting, opacifying, or anti-foaming agents, chain extending oils, tackifiers, pigments, lubricants, stabilizers, flame retardants such as decabromodiphenyl oxide, and antioxidants. A solvent or other diluent may be employed during the compounding of the formulation to lower the viscosity of the material for improved mixing.

Figure 2:
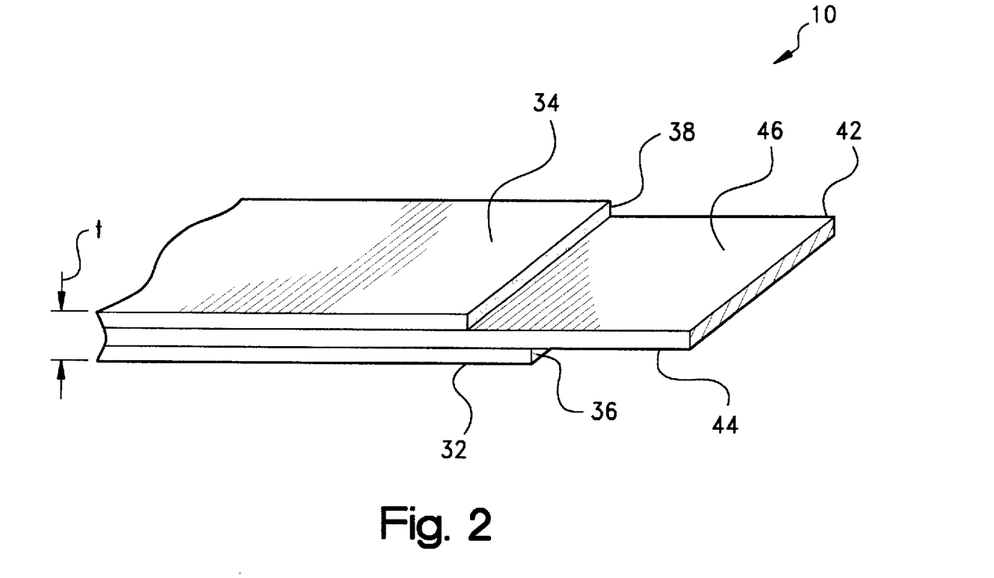
FIG. 2 is a perspective view of one embodiment of the thermally-conductive interface of the present invention as provided in the form of a double-sided, pressure sensitive adhesive tape, the view being shown with portions being broken away and sectioned to reveal the structure of the tape.

Turning to FIG. 2, a preferred embodiment of interface 30 is shown at 40 to be provided as a length of a laminated, double-sided tape including an optional interlayer carrier or reinforcement member, 42, which is incorporated as a substrate within the tape. Conventionally, reinforcement member 42, which improves the physical strength of the tape for handling, die-cutting, and the like, may be provided as a film formed of a thermoplastic material such as a polyimide, a layer of a woven fiberglass fabric or cloth, or an aluminum or other metal foil, screen, or expanded mesh. Reinforcement member 42 typically will have a thickness of from about 0.0005–0.005 inch (0.0127–0.127 mm), with a thickness of about 0.002 in (0.050 mm) being preferred for metal foils.

In the production of commercial quantities of tape 40, the acrylic and silicone PSA components of layers 36 and 38 thereof each may be separately compounded with one or more of the thermally conductive fillers under conditions of high shear in a roll mill or other mixer. After compounding, each of the admixed parts may be coated and cured on a corresponding side 44 or 46 of the reinforcement member 42 in a conventional manner, for example, by a direct process such as spraying, knife coating, roller coating, casting, drum coating, dipping, or like, or an indirect transfer process. After coating, the tape may be dried to flash the solvent and develop adherent PSA film layers 36 and 38. As mentioned, a solvent, diluent, or other vehicle may be incorporated during either compounding or coating to control the viscosity of the mixture. Moreover, and as is described further in commonly-assigned U.S. Pat. Nos. 5,213,868 and 5,298,791, at least one surface 32 and/or 34 of tape 40 may be embossed or otherwise formed with a cross-hatched or other pattern of surface channels or like (not shown) for better conformability and reduced air entrapment.

Although not considered critical for purposes of the present invention, the thicknesses of the film layers 36 and 38 coated on reinforcement member 42 may be about equal and each may be between about 0.5 mils (0.0175 mm) and 10 mils (0.25 mm), and preferably at least about 2–3 mils (0.05–0.075 mm). Advantageously, however, the preferred thicknesses of film layers 36 and 38 may be individually, i.e., separately, adjusted and varied to ensure conformability to the heat transfer surfaces. That is, for any given heat transfer application, the preferred film layer thicknesses will depend upon the relative "flatness" of the mating surfaces involved, in addition to the optimization of certain physical and thermal properties. The preferred film layer, reinforcement member, and ultimately, the overall tape thicknesses therefore will represent a convergence of such thermal and physical properties as thermal conductivity and impedance, and peel and shear adhesion strengths. As an example, with reinforcement member 42, tape 40 typically will have a thickness, referenced at "t", of between about 1 mil (0.025 mm) and 20 mils (0.5 mm), but again as may be varied depending upon the requirements of the intended heat transfer application.

Figure 3:
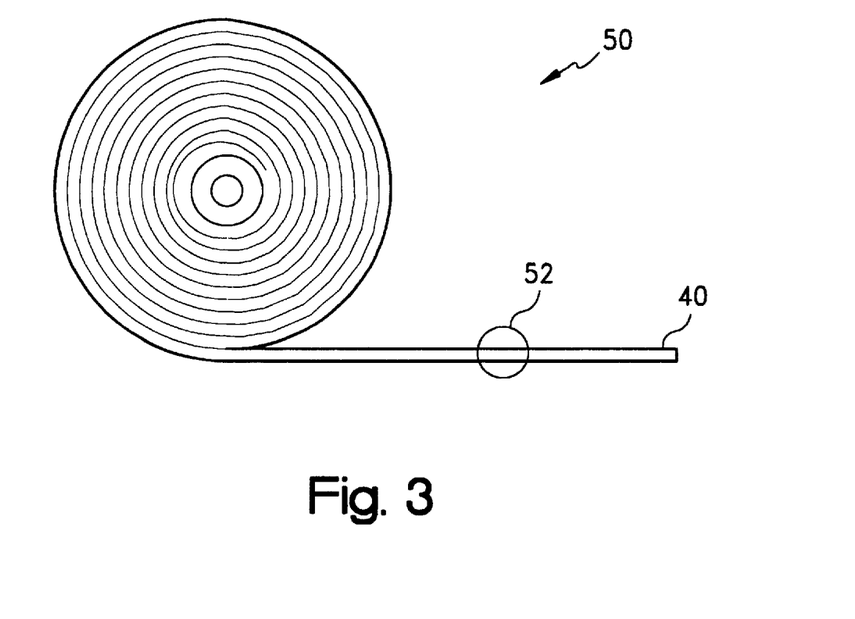
FIG. 3 is an end view of the tape of FIG. 2 as provided between a pair of release sheets and wound into a roll to facilitate the dispensing and application thereof.

For ease of use, tape 40 advantageously may be wound, as is shown generally at 50 in FIG. 3, into a roll for dispensing and application by an automated or manual process. In this regard, as die cut from roll 50 as configured for registration within the margins of the associated heat transfer surfaces, a pad of tape 40 may be bonded under pressure to the heat transfer surfaces of the assembly involved. As may be better appreciated with additional reference to FIG. 4 wherein a portion, 52, of the tape roll 50 is shown in enhanced detail, it is preferred for ease of handling that release liners, 54 and 56, are provided over the PSA surfaces 32 and 34 of the tape. Exemplary release liners include face stocks or other films of plasticized polyvinyl chloride, polyesters, cellulosics, metal foils, composites, and waxed, siliconized, or other coated paper or plastic having a relatively low surface energy to be removable without appreciable lifting of interface 30 from the substrate to which it is ultimately applied. Representative release sheets include face stocks or other films of plasticized polyvinyl chloride, polyesters, cellulosics, metal foils, composites, and the like. Alternatively, individual pre-cut pads (not shown) of tape 40 may be provided in roll form 50 as carried on release liners 54 and 56.

Figure 4:
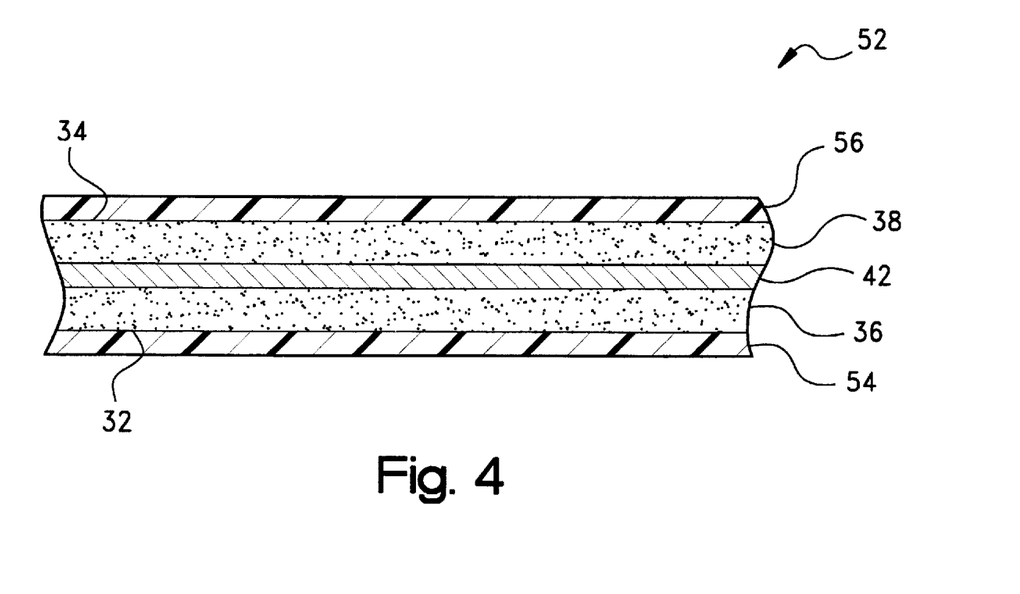
FIG. 4 is a cross-sectional edge view of a portion of the roll of FIG. 3 which is enlarged to detail the structure thereof.

In use, the heat transfer surfaces first may be wiped clean with an organic solvent. Tape 40 then may be cut to size and liner 56 removed to expose PSA surface 34. Under a moderate pressure of between about 10–30 psi (0.07–0.20 MPa) applied for about 3–15 seconds, surface 34 may be bonded to the corresponding heat transfer of, for example, the heat sink. Thereafter, liner 54 may be removed to expose PSA surface 32. With the heat sink centered over the electronic component, surface 23 may be bonded to the corresponding heat transfer surface of the component, again using a moderate pressure of between about 10–30 psi (0.07–0.20 MPa) applied for about 3–15 seconds. The ambient temperature, of course, will influence the pressure and time schedule and should be between about 22–65° C. It has been observed that about 70% of the ultimate adhesive bond strength is achieved upon initial application, with 80–90% being achieved within 15 minutes of application. The ultimate adhesive strength generally is achieved within 36 hours aging, but the next manufacturing step may be undertaken immediately following the initial application. Advantageously, interface 30 may be removed for rework of the assembly using a knife or the like inserted into the bondline, with any adhesive remaining on the surface being removable with an organic solvent wipe.

The Examples to follow, wherein all percentages and proportions are by weight unless otherwise expressly indicated, is illustrative of the practicing of the invention herein involved, but should not be construed in any limiting sense.

EXAMPLES

Example 1

A thermally-conductive interface laminate was prepared according to the presented invention for characterization by cold nipping a 2–3 mil (0.05–0.075 mm) layer of an acrylic PSA component (H&N Chemicals Polytack™ 100 LV) blended with about 50% by weight of tabular aluminum oxide (Alcoa, Pittsburgh, Pa.) onto a first side of a 0.002 in (0.050 mm) thick aluminum foil carrier. Onto the second side of the carrier was cold nipped a 2–3 mil (0.05–0.075 mm) layer of a silicone PSA component (Adhesives Research 8026) to form a double-sided PSA tape. Such tape was observed to exhibit the following physical properties:

TABLE 1

Thermal and Mechanical Properties of a Representative Interface Tape Lamination

| Property | Test Method | Units | Result |
|---|---|---|---|
| Thermal Conductivity | ASTM D5470 | W/m-° K. | 0.37 |
| Thermal Impedance | ASTM D5470 | ° C.-in$^2$/watt | 0.54 |
| 90° Peel | ASTM D1000 | PPI | 3.0 |
| Lap Shear Adhesion | ASTM D1002 | psi (MPa) | 170 (1.172) |
| Die Shear Adhesion Aluminum, 25° C. | Chomerics No. 54[1] | psi | 170 |
| Aluminum, 150° C. | | | 40 |
| Creep Adhesion | PSTC #7 | days | |
| 25° C., 12 psi (0.083 MPa) | | | >50 |
| 150° C., 12 psi (0.083 MPa) | | | >50 |

[1]Tape and six dies applied to an Al panel, exposed to 150° C. for 1000 hours, and then die shear strength tested at room temperature.

These and other physical properties will vary, of course, with the filler loading level and with the use of optional additives.

Example 2

Comparative double-sided, thermally-conductive interface tape systems were prepared to confirm the precepts of the present invention. In each of the systems, a 2.5–3 mil (0.056–0.075 mm) thick layer of an acrylic-based PSA component (H&N Chemicals Polytack™ 100 LV) blended with about 50% by weight of alumina was nipped onto a first side of a 0.002 in (0.050 mm) thick aluminum foil carrier. In a first system identified as "Sample A" in Table 2 which follows, a 1 mil (0.025 mm) layer of an unfilled, first silicone-based PSA component (Adhesives Research 8026) was nipped onto the second side of one of the carriers. Similarly, in a second system identified as "Sample B" in Table 2, a 1 mil (0.025 mm) layer of an unfilled, second silicone-based PSA component (Flexcon 1078) was nipped onto the second side of the other one of the carriers. The physical properties, namely 90° peel (ASTM D1000), lap shear (ASTM D1002) under different bond pressures, creep adhesion (PSTC #7), and die shear adhesion (Chomerics Test Procedure No. 54), of each of the sample tape systems were characterized following various thermal and vibratory exposures schedules. Where applicable, the silicone-based PSA side of the tape was bonded to a plastic substrate, namely either: (i) an injection molded epoxy packaged 40 pin, 2"×0.55" DIP chip; (ii) an injection molded epoxy packaged Top Line™ 80386 plastic quad flat pack (PQFP); or (iii) an epoxy-fiberglass FR4 composite. The acrylic-based PSA side of the tape, in turn, was bonded to either a type-2024 aluminum die or coupon. The following results and failure modes, with "S" denoting a silicone adhesive failure and "A" denoting an acrylic adhesive failure were observed:

TABLE 2

Comparative 2X-Tape Constructions

| | Control (25° C.) | | Heat Aged 1000 h @ 125° C. | | Temp. Cycling 1000 cyl. (25–125° C.) | | High Temp/Humidity 85° C./95% RH/1000 h | |
|---|---|---|---|---|---|---|---|---|
| Sample | A | B | A | B | A | B | A | B |
| Peel (ppi) | | | | | | | | |
| DIP to Al | 3.3 | 2.3 | 3.1 | 2.5 | 3.3 | 2.5 | 2.5 | 2.5 |
| Lap Shear (psi) FR4 to Al | | | | | | | | |
| 2–5 lbs | 60 | 85 | 117.2 | 123 | 127 | 66 | 132 | 180 |
| 25 lbs | 170 | 170 | | | | | | |
| Creep (days) FR4 to Al | | | | | | | | |
| 25° C., 2000 g/in² | >50 | >50 | | | | | | |
| 125° C., 500 g/in² | >9 | 0.25 | | | | | | |
| Die Shear (psi) FR4 to Al | | | | | | | | |
| 25° C. | 172-A | 170-A | 336-S[1] | 391-A[1] | | | | |
| 125° C. | 40 | 40 | 117-A[1] | 103-A[1] | | | | |
| 150° C. | 21 | 20 | | | | | | |
| 80386 PQFP to Al | | | | | | | | |
| 25° C. | 153-A | 178-A | 208-S | 333-S | 242-S | 280.5-S | | |
| 125° C. | 63.4-A | 69.3-A | | | | | 383-S | 273-S |

[1]Heat aged 168 h @ 125° C.

The foregoing results confirm that each of the respective sides of the double-side, PSA tape system of the present invention exhibits good adhesion to its corresponding high or low surface energy substrate. These results also suggest a preferred lap or die shear adhesion strength of each tape side on the corresponding high or low energy surface of at least about 100 psi (0.7 MPa), with higher values being observed under most conditions.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. An thermally conductive interface disposable intermediate a heat-generating source and a thermal dissipation member for providing a thermally conductive pathway therebetween, the heat-generating source having a first heat transfer surface formed of a first material having a low surface energy and the thermal dissipation member having a second heat transfer surface which is formed of a second material having a surface energy substantially higher than the surface energy of said first material, and which is disposable opposite the first heat transfer surface of the heat-generating source in a spaced-apart, heat transfer adjacency therewith, said interface comprising a first pressure sensitive adhesive (PSA) surface bondable under pressure to at least a portion of the first heat transfer surface of the heat-generating source, and an opposing second pressure sensitive adhesive (PSA) surface bondable under pressure to at least a portion of the second heat transfer surface of the heat-generating source, said first PSA surface being presented from a layer of a first pressure sensitive adhesive composition having an affinity to the first heat transfer surface of the heat generating source and comprising a silicone pressure sensitive adhesive component optionally blended with a first thermally-conductive filler, and said second PSA surface being presented from a layer of a second pressure sensitive adhesive composition different from said first composition and having an affinity to the second heat transfer surface of the thermal dissipation member, said second pressure sensitive adhesive composition comprising a blend of an acrylic pressure sensitive adhesive component and a second thermally-conductive filler.

2. The interface of claim 1 further comprising a substrate having a first support surface and an opposing second support surface, said layer of said first pressure sensitive adhesive composition being coated on said first support surface, and said layer of said second pressure sensitive adhesive composition being coated on said second support surface.

3. The interface of claim 2 wherein said substrate is selected from the group consisting of metal foils, polymeric films, expanded metal meshes, and fiberglass fabrics.

4. The interface of claim 1 wherein said first and said second PSA surface define a thickness dimension therebetween, and wherein said interface has a thickness of between about 1 mil (0.025 mm) and 20 mils (0.5 mm).

5. The interface of claim 1 wherein the first material has a surface energy of less than about 100 dynes/cm and the second material has a surface energy of greater than about 500 dynes/cm.

6. The interface of claim 1 wherein the first material is a plastic and the second material is a metal.

7. The interface of claim 1 wherein the heat generating source is a plastic packaged electronic component and the thermal dissipation member is a metal heat sink.

8. The interface of claim 1 wherein said first pressure sensitive adhesive composition comprises between 0% and about 10% by weight of said first thermally-conductive filler, and wherein said second pressure sensitive adhesive composition comprises between about 20% and 80% by weight of said second thermally conductive filler.

9. The interface of claim 8 wherein said first and said second thermally-conductive filler are selected from the group consisting of boron nitride, titanium diboride, aluminum oxide, aluminum nitride, magnesium oxide, zinc oxide, silicon carbide, beryllium oxide, antimony oxide, and mixtures thereof.

10. The interface of claim 1 having a thermal conductivity of between about 0.1 W/m-°K and about 1 W/m-°K.

11. The interface of claim 1 wherein said first and said second PSA surface define a thickness dimension therebetween, and wherein said layer of said first pressure sensitive adhesive composition has a thickness of between about 0.5 mils (0.0175 mm) and 10 mils (0.25 mm), and said layer of said second pressure sensitive adhesive composition has a thickness of between about 0.5 mils (0.0175 mm) and 10 mils (0.25 mm).

12. The interface of claim 1 wherein said first pressure sensitive adhesive composition exhibits one or both of a lap or die shear adhesion strength, according to ASTM D1002 or Chomerics Test Procedure No. 54, respectively, of at least about 100 psi (0.7 MPa) to said first material, and wherein said second pressure sensitive adhesive composition exhibits one or both of a lap or die shear adhesion, according to ASTM D1002 or Chomerics Test Procedure No. 54, respectively, of at least about 100 psi (0.7 MPa) to said second material.

* * * * *